US006441686B1

(12) United States Patent
Nakamura

(10) Patent No.: US 6,441,686 B1
(45) Date of Patent: Aug. 27, 2002

(54) OFFSET CORRECTION METHOD AND APPARATUS

(75) Inventor: Katsufumi Nakamura, Boston, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/580,891

(22) Filed: May 30, 2000

Related U.S. Application Data

(60) Provisional application No. 60/137,657, filed on Jun. 4, 1999.

(51) Int. Cl.[7] ............................. H03F 1/34; H03G 3/20
(52) U.S. Cl. ........................................ 330/85; 330/134
(58) Field of Search ........................... 330/85, 86, 134, 330/282, 308; 327/307; 250/214 AG; 333/214, 215; 348/678

(56) References Cited

U.S. PATENT DOCUMENTS

| | | | | |
|---|---|---|---|---|
| 3,529,258 A | * | 9/1970 | Schulz | 330/85 |
| 3,918,014 A | * | 11/1975 | Voorman | 333/215 X |
| 3,919,654 A | * | 11/1975 | Toumani | 330/134 X |
| 4,562,406 A | * | 12/1985 | Baker | 330/85 |
| 4,646,036 A | * | 2/1987 | Brown | 330/134 X |
| 5,757,230 A | | 5/1998 | Mangelsdorf | |
| 5,757,440 A | | 5/1998 | Mangelsdorf | |
| 6,028,496 A | * | 2/2000 | Ko et al. | 333/214 |

OTHER PUBLICATIONS

Gregorian and Temes, "Analog MOS Integrated Circuits For Signal Processing," Wiley–Interscience, 1986, pp. 412–417.
Wierzba et al. "Synthesis of Temperature Variable Capacitors" IEEE 1982 International Symposium on Circuits & Systems May 10–12, 1982, pp. 194–197.*

* cited by examiner

*Primary Examiner*—Steven J. Mottola
(74) *Attorney, Agent, or Firm*—Wolf, Greenfield & Sacks, P.C.

(57) ABSTRACT

A method and apparatus for reducing offset errors in a variable gain circuit is offered. A first programmable gain amplifier is located in a feedforward signal path and a second programmable amplifier is connected in feedback with the first programmable gain amplifier. Each programmable gain amplifier has a separate gain control circuit so that the gain of each programmable gain amplifier can be independently controlled.

46 Claims, 4 Drawing Sheets

OFFSET CORRECTION METHOD AND APPARATUS

RELATED APPLICATION

This application claims the benefit of the fling date, under 35 U.S.C. §119(e), of provisional application Ser. No. 60/137,567 filed Jun. 4, 1999.

FIELD OF THE INVENTION

The present invention relates to variable gain circuits and, more particularly, to an improved circuit and method for reducing offset errors in a variable gain circuit.

BACKGROUND

A charge-couple device (CCD) is the sensor of choice in modern imaging to convert photons into electrons, hence enabling the use of electronics for image processing. FIG. 1 shows typical analog front-end building blocks for a CCD signal processing channel. The CCD input signal 100 is received by a correlated double sampling circuit (CDS) 102 whose function is to extract the image content from the CCD signal 100 and remove an unwanted correlated noise component. The output of the CDS 102 is amplified by a programmable gain amplifier (PGA) 104 before it gets converted to digital data by an analog-to-digital converter (ADC) 106. The gain of the PGA can be programmed by providing a gain input to the gain control circuit which controls the gain in the PGA.

In reality, the circuit building blocks have offset, and such offset can reduce the dynamic range of the processing channel. In particular, an offset input to the PGA can get amplified by the PGA by an amount of the gain of the PGA, and hence seriously reduce the useful dynamic range of the PGA output and ADC. Such an offset can come from the CCD signal, the CDS, or can be the input referred offset of the PGA. For example, an offset of 10 mV input into a PGA with a gain of 50x, yields an output referred offset at the output of the PGA of 0.5V. This reduces the dynamic range of the PGA output and ADC by 0.5V, which is not acceptable in most integrated circuit design applications.

In order to address this problem, an offset correction is typically used. One way to provide an offset correction is to integrate the output of the PGA and subtract the accumulated error from the input of the PGA in a feedback fashion. The feedback will adjust the input of the PGA such that the output of the PGA is equal to the system's "zero" reference. This scheme is shown in FIG. 2. In this figure, INT 200 refers to an integrator.

One problem with the scheme of FIG. 2 is that the time constant of the loop depends on the gain of the PGA 104. To keep the feedback loop stable and the noise of the "zero" reference low, it is preferable to keep the bandwidth of the loop low and constant, thereby keeping the loop gain constant with varying PGA gain. This can be accomplished by inserting another PGA in the feedback path with a reciprocal gain characteristic of the PGA in the forward path. This is called a reverse PGA (RPGA) 300, which is shown in FIG. 3. The gain characteristics of PGA and RPGA and the loop gain are shown in FIG. 4. In FIG. 4, shown are the gain of the RPGA, the gain of the PGA, and the loop gain, each with respect to the gain input provided to the gain control circuit. In terms of the dynamics of the loop, the order of RPGA 300 and INT 200 in the feedback path does not matter, but it does have circuit level consequences that usually limit the circuit to having INT 200 on the output side of the PGA 104.

One problem with the modified scheme of FIG. 3 is that any offset at the input side of the PGA 104 gets gained back to the input of the RPGA 300 or the output of the INT 200. This offset can consist of the CCD's offset, the CDS' offset, or the input referred offset of the PGA, and can be substantial. Although this offset does not directly affect the dynamic range of the processing channel itself (CDS, PGA, and ADC), it severely limits the operation of the RPGA and INT when the gain of the PGA is high. Again, an offset of 10 mV with a 50x gain in the PGA gets referred back to the input of RPGA as 0.5V. Under a large offset condition, the offset correction scheme of FIG. 3 fails to operate due to the limited headroom range of the RPGA 300 and INT 200.

SUMMARY

One embodiment of the invention is directed to a variable gain circuit that includes a first PGA in a feedforward signal path and a second PGA connected in feedback with the first PGA. The variable gain circuit need not be used in an image sensor application (e.g., CCD) as disclosed herein, but may be any variable gain circuit in which it is desired to reduce offset errors of the circuit. An embodiment of the invention includes circuitry for controlling the gain of the first PGA and controlling the gain of the second PGA, independently of one another.

Another embodiment of the invention is directed to a method for correcting offset errors in a variable gain circuit including a first PGA and a second PGA connected in feedback with the first PGA. The method includes the steps of: controlling a gain of the first PGA, controlling a gain of the second PGA independently from the gain control of the first PGA.

DETAILED DESCRIPTION

Figure 5:
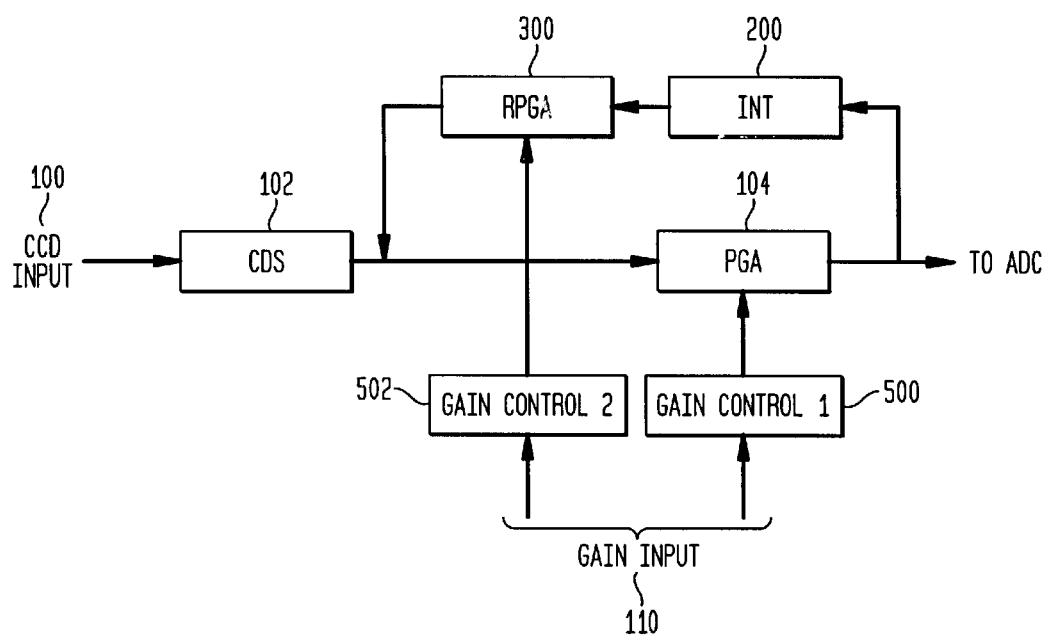
FIG. 5 shows a block diagram of a CCD signal processing channel with modified gain control.

One embodiment of the invention is shown in FIG. 5. Shown is a variable gain circuit with which the method and circuit of the invention may be used. The variable gain circuit may include a first PGA 104 in a feedforward signal path and a second PGA 300 connected in feedback with the first PGA 104, as shown in FIG. 5. The feedback path also may include an integrator (INT) 200.

The embodiment contemplates controlling the gain of the first PGA 104 and controlling the gain of the second PGA 300, independently of one another. This is illustrated in FIG. 5 where a first gain control circuit 500 controls the gain of the first PGA 104 and a second gain control circuit 502 controls the gain of the second PGA 300. The two gains may be completely unrelated or may be related, but importantly, each can be controlled independently of the other.

By separating the gain control of the PGA and RPGA the embodiment partially decouples the reciprocal relationship of the PGA and RPGA gains. By separating the gain relationship the embodiment also separates the relationship between noise and offset between which circuit designers were often forced to choose. More flexibility is provided to alter the RPGA and/or loop gains so that more precise control can be exerted over the circuit behavior.

A specific embodiment of the invention shown as a CCD image sensor in FIG. 5 shows the variable gain circuit with which the invention is used. It should be appreciated that the invention is not so limited and that the invention can be used with any variable gain circuit for which it is desired to reduce offset errors. This invention can be applied to processing of other types of signals, and is not limited to the processing of a CCD signal.

The circuit employs one gain control circuit 500 to control the gain of the PGA 104 and a separate gain control circuit 502 to independently control the gain of the RPGA 300. This allows the gain characteristic of the RPGA 300 to be set independently of that of the PGA 104.

Figure 6:
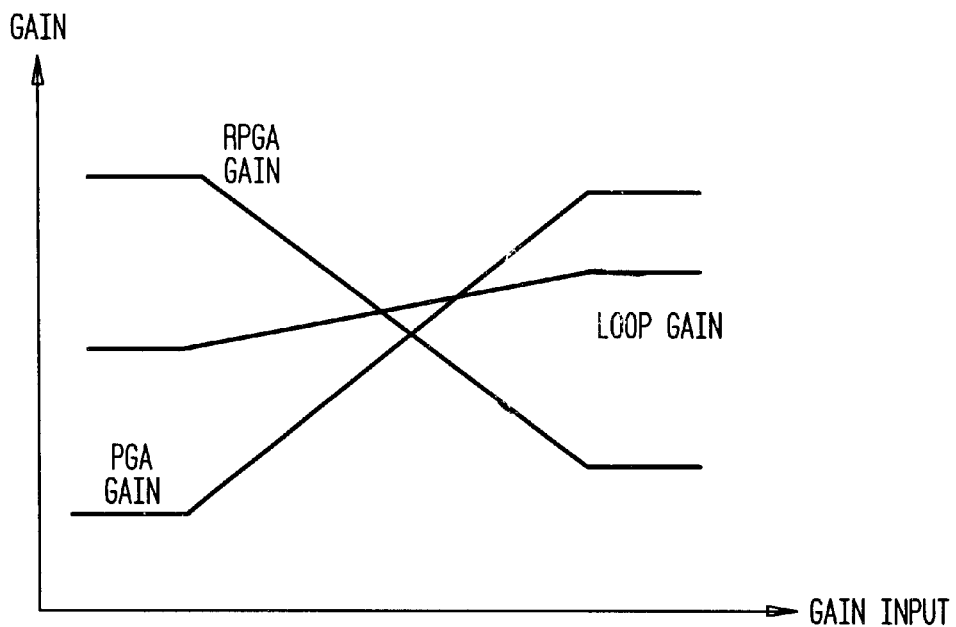
FIG. 6 shows the PGA, RPGA, and loop gain characteristic of one embodiment of the circuit in FIG. 5.

One example is shown in FIG. 6 in which the gain of the RPGA, the gain of the PGA, and the loop gain are each shown with respect to the gain input provided to the gain control circuits. In this example, the reciprocal slope of the RPGA is set to be lower than the slope of the PGA so that the loop gain has a positive slope as the gain input is increased. The benefit of doing this is so that one can select the loop gain to be low at low gain input to keep the noise of the loop low, and then set the loop gain at high gain high to be higher to increase the offset correction range in the loop. A low loop gain is important for noise since it lowers the bandwidth of the loop; hence more noise gets rejected. On the other hand, a high loop gain is important for the offset correction range since it allows more input referred offset to be corrected for the same headroom in the RPGA and INT.

Figure 1:
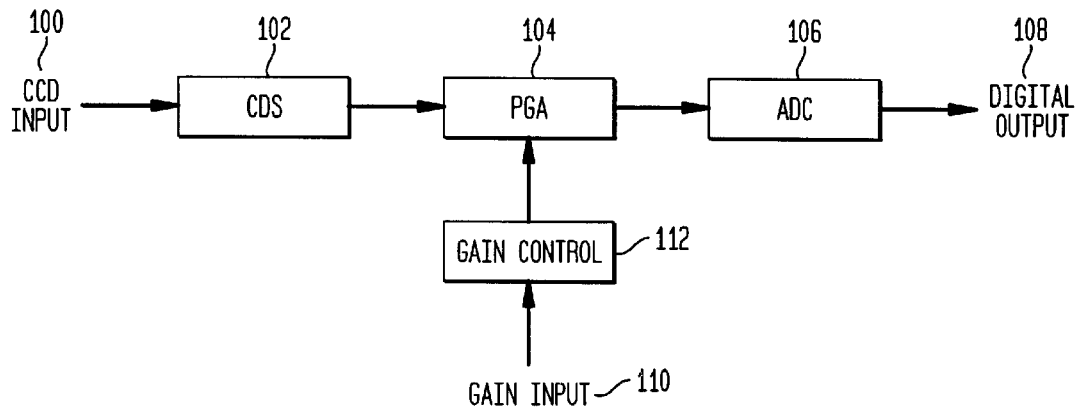
FIG. 1 shows a block diagram of a CCD signal processing channel according to the prior art.
Figure 2:
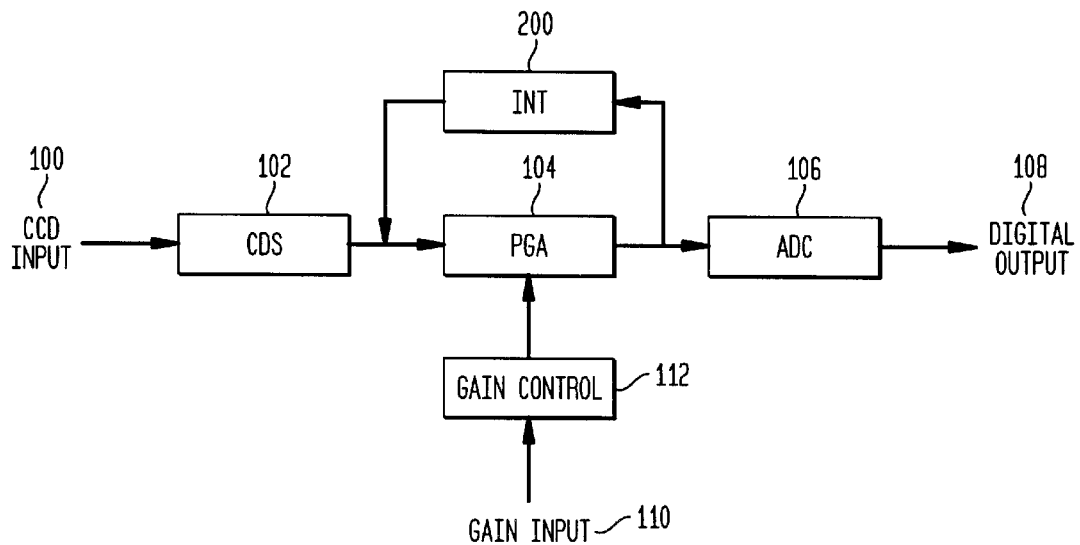
FIG. 2 shows a block diagram of a CCD signal processing channel with offset correction according to the prior art.
Figure 3:
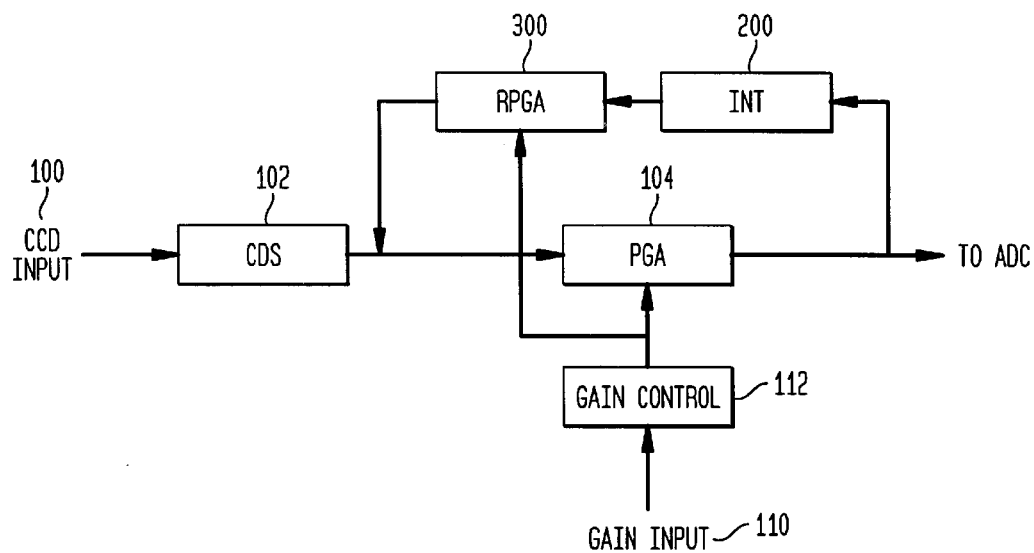
FIG. 3 shows a block diagram of a CCD signal processing channel with offset correction and constant loop gain according to the prior art.
Figure 4:
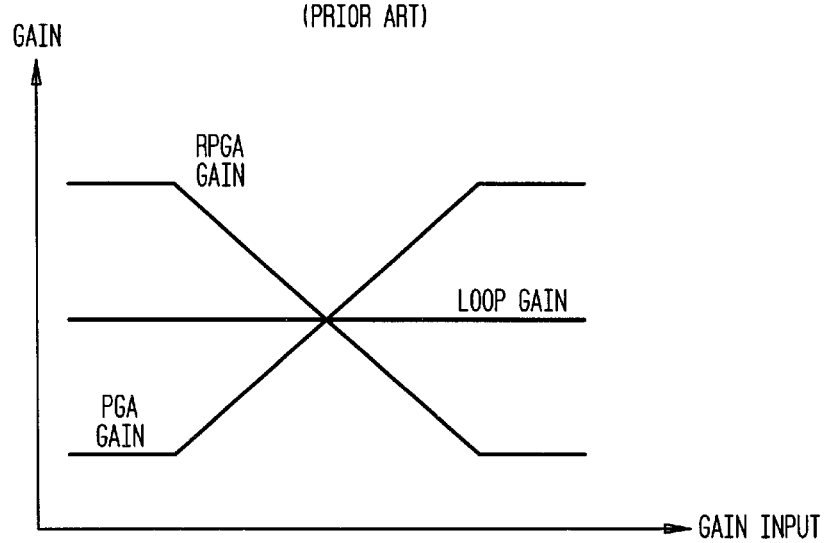
FIG. 4 shows the PGA, RPGA, and loop gain characteristic of the circuit shown in FIG. 3 according to the prior art.
Figure 7:
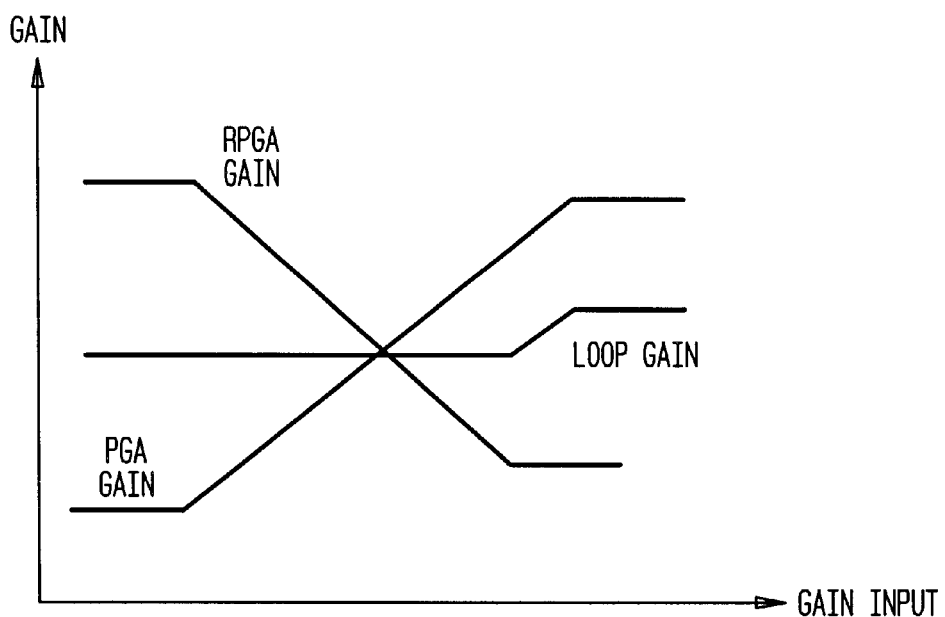
FIG. 7 shows the PGA, RPGA, and loop gain characteristic of one embodiment of the circuit of FIG. 5.

FIG. 7 shows another example using the modified gain control scheme of FIG. 5. In this example, the gain of the RPGA has the same slope as FIG. 4, but it clips to a higher gain limit. Again, the result is that the loop gain ends up at a higher gain than in the FIG. 4 example, and the offset correction range can be increased. For both the examples of FIGS. 6 and 7, the loop gain at low gain is at the same level as that of FIG. 4 (low noise), but the loop gain at high gain is higher than that of FIG. 4, and therefore, it can handle more input referred offset.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. A variable gain circuit comprising:
    a first PGA receiving a first gain control input signal;
    a second PGA, receiving a second gain control input signal, connected in feedback with the first PGA in a feedback loop;
    a first gain control circuit that controls a gain of the first PGA; and
    a second gain control circuit that controls a gain of the second PGA dependently from the gain control of the first PGA wherein the feedback loop has a loop gain with a non-zero slope as a function of any of the first and second gain control input signals.

2. A variable gain circuit comprising:
    a first PGA receiving a first gain control input signal;
    a second PGA, receiving a second gain control input signal, connected in feedback with the first PGA in a feedback loop, wherein the second PGA has an inverse characteristic of the first PGA;
    a first gain control circuit that controls a gain of the first PGA; and
    a second gain control circuit that controls the gain of the second PGA independently from the gain control of the first PGA wherein the feedback loop has a loop gain with a non-zero slope as a function of any of the first and second gain control input signals.

3. A method for reducing offset errors in a variable gain circuit including a first PGA and second PGA connected in feedback in a feedback loop with the first PGA, the method comprising:
    controlling a gain of the first PGA; and
    controlling a gain of the second PGA independently from the gain of the first PGA, wherein controlling any of the gain of the first PGA and the gain of the second PGA results in changing a gain of the feedback loop.

4. A variable gain circuit as claimed in claim 1, wherein the first and the second gain control input signals are unrelated.

5. A variable gain circuit as claimed in claim 1, wherein the first and the second gain control input signals are related.

6. A variable gain circuit as claimed in claim 1, wherein the second PGA is a reverse PGA (RPGA).

7. A variable gain circuit as claimed in claim 1, further comprising an image sensor coupled to an input of the variable gain circuit.

8. A variable gain circuit as claimed in claim 7, wherein the image sensor comprises a CCD.

9. A variable gain circuit as claimed in claim 1, wherein the gain of the first PGA and the gain of the second PGA are related by a reciprocal relationship.

10. A variable gain circuit as claimed in claim 9, wherein the reciprocal relationship comprises a first gain characteristic of the first PGA and a second gain characteristic of the second PGA, the first gain characteristic having a reciprocal relationship relative to the second gain characteristic.

11. A variable gain circuit as claimed in claim 10, wherein the first gain characteristic has a first slope that is lower than a second slope of the second gain characteristic.

12. A variable gain circuit as claimed in claim 10, wherein the second gain characteristic has a second slope that is lower than a first slope of the first gain characteristic.

13. A variable gain circuit as claimed in claim 1, further comprising an integrator in series with the second PGA.

14. A variable gain circuit as claimed in claim 13, wherein the integrator is disposed between an output of the first PGA and an input of the second PGA.

15. A variable gain circuit as claimed in claim 1, further comprising a correlated double sampling circuit coupled to an input of the first PGA.

16. A method as claimed in claim 3, wherein controlling a gain of the first PGA comprises controlling a first gain control input signal to a first gain control circuit.

17. A method as claimed in claim 3, wherein controlling a gain of the second PGA comprises controlling a second gain control input signal to a second gain control circuit.

18. A method as claimed in claim 3, further comprising integrating a first PGA output signal using an integrator placed in series with the second PGA.

19. A method as claimed in claim 3, further comprising decoupling a reciprocal relationship between the gain of the first PGA and the gain of the second PGA.

20. A method as claimed in claim 3, further comprising rejecting noise by selecting a loop gain to be sufficiently low to substantially reject said noise.

21. A method as claimed in claim 3, further comprising correcting for input referred offset by selecting a loop gain to be sufficiently high to substantially correct said offset.

22. A method as claimed in claim 3, further comprising both rejecting noise and correcting for input referred offset by selecting a loop gain to be sufficiently low to substantially reject said noise and sufficiently high to substantially correct said offset.

23. A method as claimed in claim 3, further comprising sensing an image and generating a signal corresponding to the image as an input to the variable gain circuit.

24. A method as claimed in claim 3, further comprising performing a correlated double sampling of an input of the variable gain circuit using a correlated double sampling circuit.

25. A variable gain circuit as claimed in claim 2, wherein the first and the second gain control input signals are unrelated.

26. A variable gain circuit as claimed in claim 2, wherein the first and the second gain control input signals are related.

27. A variable gain circuit as claimed in claim 2, wherein the second PGA is a reverse PGA (RPGA).

28. A variable gain circuit as claimed in claim 2, further comprising an image sensor coupled to an input of the variable gain circuit.

29. A variable gain circuit as claimed in claim 28, wherein the image sensor comprises a CCD.

30. A variable gain circuit as claimed in claim 2, wherein the gain of the first PGA and the gain of the second PGA are related by a reciprocal relationship.

31. A variable gain circuit as claimed in claim 30, wherein the reciprocal relationship comprises a first gain characteristic of the first PGA and a second gain characteristic of the second PGA, the first gain characteristic having a reciprocal relationship relative to the second gain characteristic.

32. A variable gain circuit as claimed in claim 31, wherein the first gain characteristic has a first slope that is lower than a second slope of the second gain characteristic.

33. A variable gain circuit as claimed in claim 31, wherein the second gain characteristic has a second slope that is lower than a first slope of the first gain characteristic.

34. A variable gain circuit as claimed in claim 2, further comprising an integrator in series with the second PGA.

35. A variable gain circuit as claimed in claim 34, wherein the integrator is disposed between an output of the first PGA and an input of the second PGA.

36. A variable gain circuit as claimed in claim 2, further comprising a correlated double sampling circuit coupled to an input of the first PGA.

37. A method for reducing offset errors in a variable gain circuit including a first PGA and a second PGA connected in feedback, in a feedback loop, with first PGA, the method comprising:

controlling a gain of the first PGA using a first gain control circuit; and controlling a gain of the second PGA independently from the gain control of the first PGA using a second gain control circuit, wherein controlling any of the gain of the first PGA and the gain of the second PGA results in changing a gain of the feedback loop.

38. A method as claimed in claim 37, wherein controlling a gain of the first PGA comprises controlling a first gain control input signal to the first gain control circuit.

39. A method as claimed in claim 37, wherein controlling a gain of the second PGA comprises controlling a second gain control input signal to the second gain control circuit.

40. A method as claimed in claim 37, further comprising integrating a first PGA output signal using an integrator placed in series with the second PGA.

41. A method as claimed in claim 37, further comprising decoupling a reciprocal relationship between the gain of the first PGA and the gain of the second PGA.

42. A method as claimed in claim 37, further comprising rejecting noise by selecting a loop gain to be sufficiently low to substantially reject said noise.

43. A method as claimed in claim 37, further comprising correcting for input referred offset by selecting a loop gain to be sufficiently high to substantially correct said offset.

44. A method as claimed in claim 37, further comprising both rejecting noise and correcting for input referred offset by selecting a loop gain to be sufficiently low to substantially reject said noise and sufficiently high to substantially correct said offset.

45. A method as claimed in claim 37, further comprising sensing an image and generating a signal corresponding to the image as an input to the variable gain circuit.

46. A method as claimed in claim 37, further comprising performing a correlated double sampling of an input of the variable gain circuit using a correlated double sampling circuit.

* * * * *

UNITED STATES PATENT AND TRADEMARK OFFICE
CERTIFICATE OF CORRECTION

PATENT NO. : 6,441,686 B1
DATED : August 27, 2002
INVENTOR(S) : Katsufumi Nakamura It is certified that error appears in the above-identified patent and that said Letters Patent is hereby corrected as shown below:

<u>Column 3,</u>
Line 67, delete the word "dependently" and insert -- independently --.

Signed and Sealed this

Twelfth Day of November, 2002

*Attest:*

*Attesting Officer*

JAMES E. ROGAN
*Director of the United States Patent and Trademark Office*